United States Patent
Pallasmaa

(10) Patent No.: US 8,564,958 B2
(45) Date of Patent: Oct. 22, 2013

(54) ELECTRICAL CABINET

(75) Inventor: Aaro Pallasmaa, Espoo (FI)

(73) Assignee: ABB Oy, Helsinki (FI)

( * ) Notice: Subject to any disclaimer, the term of this patent is extended or adjusted under 35 U.S.C. 154(b) by 440 days.

(21) Appl. No.: 12/781,340

(22) Filed: May 17, 2010

(65) Prior Publication Data

US 2010/0290196 A1    Nov. 18, 2010

(30) Foreign Application Priority Data

May 15, 2009  (EP) ..................................... 09160361

(51) Int. Cl.
*H05K 5/00*    (2006.01)
*H05K 7/00*    (2006.01)

(52) U.S. Cl.
USPC .................. 361/724; 361/679.01; 361/679.02

(58) Field of Classification Search
USPC ............... 361/679.01, 679.02, 679.55, 679.6, 361/724, 725, 726
See application file for complete search history.

(56) References Cited

U.S. PATENT DOCUMENTS

| | | | |
|---|---|---|---|
| 4,322,737 A * | 3/1982 | Sliwa, Jr. ...................... | 257/719 |
| 5,242,044 A * | 9/1993 | Yamaguchi et al. ........ | 198/377.1 |
| 5,242,644 A * | 9/1993 | Thompson et al. ...... | 264/177.15 |
| 7,677,052 B2 * | 3/2010 | Shah et al. .................... | 62/259.2 |
| 2003/0112587 A1 * | 6/2003 | Krause et al. ................. | 361/679 |
| 2003/0194964 A1 * | 10/2003 | Champeau et al. .......... | 454/146 |
| 2004/0140114 A1 | 7/2004 | Wagner | |
| 2010/0012300 A1 * | 1/2010 | Moon et al. .............. | 165/104.26 |

FOREIGN PATENT DOCUMENTS

| | | |
|---|---|---|
| CN | 1901304 | 1/2007 |
| DE | 39 33 328 A1 | 6/1990 |

OTHER PUBLICATIONS

An English Translation of the Office Action (Notification of the First Office Action) dated Jul. 26, 2011, issued in the corresponding Chinese Patent Application No. 201010178565.0.
European Search Report for EP 09160361.3 dated Oct. 21, 2009.

* cited by examiner

*Primary Examiner* — Anthony Haughton
(74) *Attorney, Agent, or Firm* — Buchanan Ingersoll & Rooney PC

(57) ABSTRACT

The disclosure relates to an electrical cabinet for receiving and enclosing an electrical apparatus such that the electrical apparatus can be isolated from surroundings by the electrical cabinet. To address water condensing inside the electrical cabinet, a roof construction of the electrical cabinet includes at least a first capillary part located above the electrical apparatus, and the first capillary part includes capillary grooves for recovering liquid condensing on the first capillary part.

10 Claims, 2 Drawing Sheets

ELECTRICAL CABINET

RELATED APPLICATIONS

This application claims priority under 35 U.S.C. §119 to European Patent Application No. 09160361.3 filed in Europe on May 15, 2010, the entire contents of which is hereby incorporated by reference in its entirety.

FIELD

This disclosure relates to an electrical cabinet, and to condensing problems which can occur within such a cabinet.

BACKGROUND INFORMATION

Water can cause significant damages to an electrical apparatus. Electrical cabinets are therefore designed, depending on their intended installation site, to address water penetration in a way that can ensure that water cannot penetrate into the electrical cabinet and damage the electrical apparatus enclosed therein.

However, a phenomenon which can be difficult to avoid is condensation. If the temperature of the surroundings, for example, outside the electrical cabinet, is sufficiently lower than the temperature within the electrical cabinet, then there can be a risk of condensation on the inner surfaces of the electrical cabinet. In case of condensation on the inner side of the roof of the electrical cabinet, water may drop down onto the electrical apparatus installed in the electrical cabinet and ultimately damage the electrical apparatus.

SUMMARY

An electrical cabinet is provided for receiving and enclosing an electrical apparatus. The electrical cabinet comprises a roof construction, walls, and a bottom. The roof construction, walls and bottom of the electrical cabinet adjoin each other to prevent dirt and water from entering the electrical cabinet. At least a first capillary part of the roof construction located above an electrical apparatus when enclosed in the electrical cabinet includes capillary grooves for recovering liquid condensing on the first capillary part.

BRIEF DESCRIPTION OF THE DRAWINGS

The present disclosure will be described in closer detail by way of example, with reference to the attached drawings, in which.

DETAILED DESCRIPTION

An electrical cabinet is disclosed that can minimize the risk of damages due to condensation.

In the present disclosure, a roof construction of an exemplary electrical cabinet includes a capillary part with capillary grooves at a location above the electrical apparatus when such an apparatus is placed within the cabinet. These capillary grooves can be utilized for recovering liquid condensing on a bottom side of the capillary part. Instead of dropping down the electrical apparatus, the condensed water can be recovered by sucking it into the capillary grooves due to capillary action.

Figure 1:
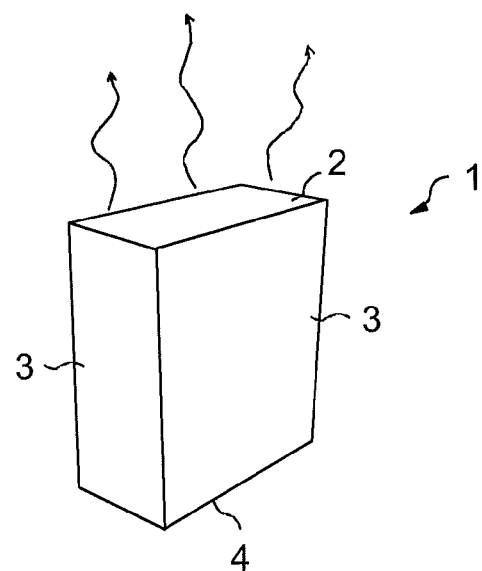
FIG. 1 illustrates a first exemplary embodiment of an electrical cabinet.
Figure 2:
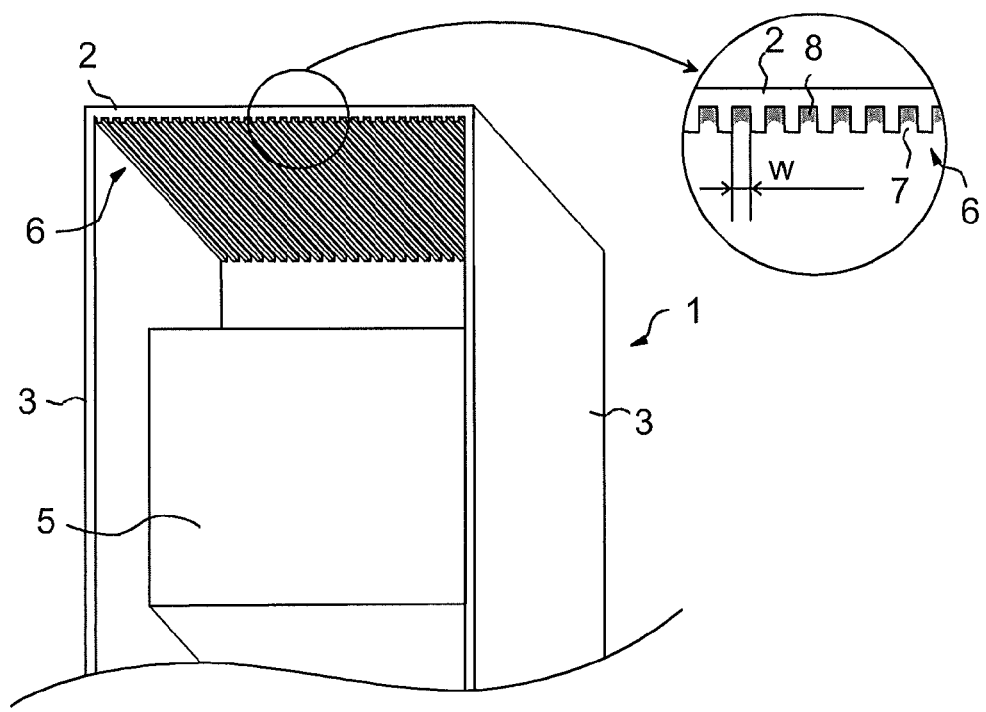
FIG. 2 illustrates an exemplary roof construction of the electrical cabinet of FIG. 1.

FIGS. 1 and 2 illustrate a first exemplary embodiment of an electrical cabinet 1. FIG. 1 illustrates an outside view of an exemplary electrical cabinet 1 and FIG. 2, a front view where a door is opened or one of the side walls 3 has been removed in order to illustrate the interior of the electrical cabinet.

During use, a roof construction 2, walls 3 and a bottom 4, respectively, adjoin each other to isolate an electrical apparatus 5 from the surroundings so that dirt and water can be prevented from entering the electrical cabinet. Thus, the roof construction, walls and bottom restrict free flow of air between the inside and outside of the electrical cabinet. Such an air flow may exist, but the flow can be weak when compared to an open electrical cabinet. In case of an electrical cabinet placed on a floor (in a building) or on the ground (outside), a separate bottom is not absolutely necessary. Instead the floor or the ground can act as a bottom of the electrical cabinet.

During use of the electrical apparatus 5, which may include power electronics of a frequency converter, for example, heat can be generated into the interior of the exemplary electrical cabinet 1. The generated heat can raise the temperature of the roof construction 2, walls 3 and bottom 4 of the exemplary electrical cabinet 1.

Once the use of the electrical apparatus 5 and the resulting heat generation inside the exemplary electrical cabinet 1 ends, the temperature of the roof construction 2, walls 3 and bottom 4 can begin to drop towards the temperature of the surroundings. If the temperature of the surroundings is sufficiently low, then it is possible that the temperature of the roof construction 2, walls 3 and bottom 4 falls below the dew point of the air inside the exemplary electrical cabinet 1. This can lead to condensation in the exemplary electrical cabinet 1. Such condensation (which may also occur in other situations than the described one) can be very harmful for the electrical apparatus 5, especially if condensation occurs on the inner surface of the roof which is located directly above the electrical apparatus. In that case water drops may end up falling directly towards the electrical apparatus 5.

In order to avoid such negative effects of condensation at least directly above the electrical apparatus 5, at least the roof construction 2 can include a first capillary part 6 located above the electrical apparatus. In the exemplary embodiment of FIGS. 1 and 2, the first capillary part 6 can be integrated into a flat plate that acts as the roof of the electrical cabinet. Alternatively, it can be possible to arrange a capillary part 6 as an additional element towards the inner surface of the roof. The roof with an integral capillary part or a separate capillary part can be manufactured of aluminum by extrusion, for instance.

The first capillary part 6 can include, on a bottom side facing the electrical apparatus 5, capillary grooves 7 for recovering liquid, in this case water, condensing on the bottom side of the capillary part 6. Instead of dropping down as water drops onto the electrical apparatus 5, the condensed water 8 can be recovered by sucking it into the capillary grooves due to capillary effect or capillary action. In the illustrated example, the capillary part can be provided with capillary grooves 7 having a width W, which can be smaller than 1 mm to 0.5 mm. In practice it has been shown that the capillary action can be strong when the width of the grooves W is 0.4 mm and the depth of the grooves is 0.4 mm. It has also been shown that the capillary action can be strong when the width of the grooves W is 0.34 mm and the depth of the grooves is 0.8 mm. It can also be possible to use even smaller dimensions, such as 0.12 mm as the width of the grooves, 0.24 as the depth of the grooves and 0.04 mm as the interval between the grooves. However, it should be observed that these dimensions are only examples of suitable dimensioning, while within the scope of the disclosure also other dimensions can be used.

In an exemplary embodiment, the amount of water 8 recovered by the capillary grooves 7 should be small enough to remain in the capillary grooves 7 until the electrical apparatus 5 used for a next working cycle. At that stage the heat generated by the electrical apparatus 5 can evaporate the water such that the capillary grooves can be dried up by the air inside the electrical cabinet. However, where it is desired to ensure that the capillary grooves 7 are not overfilled at any stage, which increases the risk of water dropping down onto the electrical apparatus 5, the capillary part 6 can be arranged in a position where it forms a small angle with respect to a horizontal plane. Thus, the water can flow along the capillary part 6 towards the lowest part of the capillary part 6, for example, close to a selected wall, from where it can be led forward by suitable channels out of the electrical cabinet, for instance. In this way, excess water can be led away without damaging the electrical apparatus 5.

The use of the above-described first capillary part 6 can be most advantageous for an exemplary electrical cabinet 1 used in an outdoor installation, where the electrical apparatus 5 enclosed by the exemplary electrical cabinet 1 is working periodically. However, advantages can be achieved also in connection with other electrical cabinets. In this context a periodically working apparatus refers to an apparatus which can be in use during certain periods of time and out of use during other periods of time. In outdoor installations temperature differences may be very large, especially in the nighttime. If the use of a periodically used electrical apparatus 5 in such an outdoor electrical cabinet is ended during the night, then an excessive temperature drop can be anticipated, which will eventually lead to condensation in an electrical cabinet 1.

Figure 3:
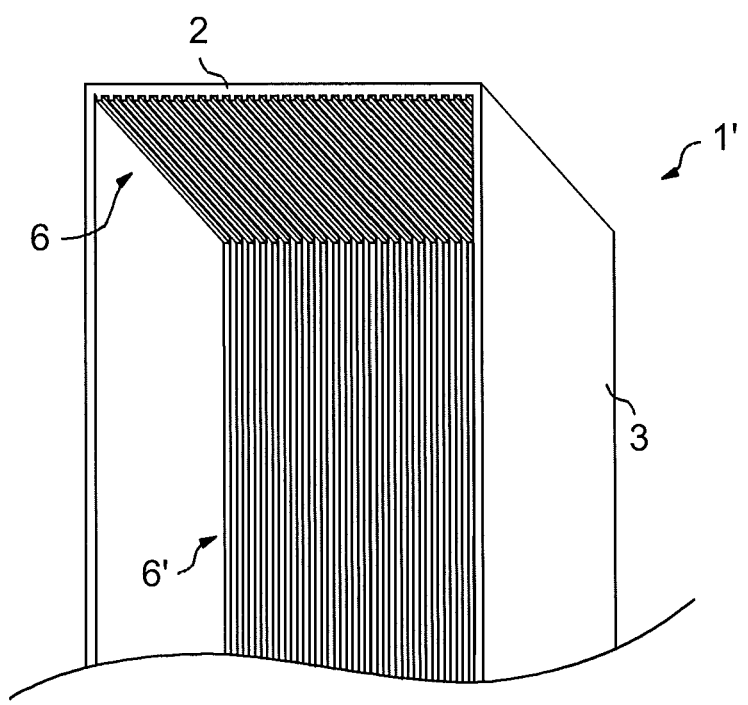
FIG. 3 illustrates an exemplary second embodiment of an electrical cabinet.

FIG. 3 illustrates a second exemplary embodiment of an electrical cabinet 1'. The embodiment of FIG. 3 is very similar to the one explained in connection with FIGS. 1 and 2. Therefore, the exemplary embodiment of FIG. 3 will be explained in the following mainly by pointing out the differences between these embodiments.

In addition to the first capillary part 6 located in the roof construction 2 of the exemplary electrical cabinet 1', the exemplary electrical cabinet 1' includes at least one second capillary part 6'. The second capillary part 6' can be arranged in a wall construction of a wall 3 of the exemplary electrical cabinet 1' and can include capillary grooves similar to those explained in connection with the first capillary part 6. The second capillary part 6' can increase the capability of the exemplary electrical cabinet 1' of recovering liquid condensing in the exemplary electrical cabinet, and therefore more than one such second capillary part 6' can be utilized in the exemplary electrical cabinet in connection with the walls 3, for instance.

Similarly to what was explained regarding the first capillary part 6, the second capillary part 6' can be integrated into a wall, or alternatively accomplished by arranging a separate second capillary part 6' against an inner surface of a wall 3, for instance.

It is to be understood that the above description and the accompanying figures are only intended to illustrate the exemplary embodiments disclosed herein.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. An electrical cabinet for receiving and enclosing an electrical apparatus comprising:
   a non-perforated roof construction preventing dirt, water, and air from entering the electrical cabinet, and which includes an inner surface of a roof;
   walls;
   a bottom, wherein the roof construction, walls and bottom of the electrical cabinet adjoin each other to prevent dirt and water from entering the electrical cabinet and which restrict flow of air between the inside and outside of the electrical cabinet; and
   at least a first capillary part on the inner surface of the roof construction located above an electrical apparatus when enclosed in the electrical cabinet, said first capillary part including, on a bottom side facing the electrical apparatus, capillary grooves for recovering liquid condensing on the first capillary part.

2. The electrical cabinet according to claim 1, wherein said first capillary part comprises:
   at least one plate which forms the roof of the electrical cabinet.

3. An electrical cabinet according to claim 1, comprising:
   an electrical apparatus for periodically generating heat into an interior of said electrical cabinet.

4. An electrical cabinet according to claim 1, wherein said electrical cabinet comprises:
   at least one second capillary part in a wall construction of said electrical cabinet, said second capillary part including capillary grooves on a side which would face said electrical apparatus for recovering liquid condensing on said side.

5. An electrical cabinet according to claim 1, wherein said capillary grooves have a width which is smaller than 1 mm.

6. An electrical cabinet according to claim 1, wherein said capillary grooves have a width which is smaller than 0.5 mm.

7. An electrical cabinet according to claim 1, wherein a depth of the capillary grooves is 0.2 mm to 1.0 mm.

8. An electrical cabinet according to claim 2, comprising:
   an electrical apparatus for periodically generating heat into an interior of said electrical cabinet.

9. An electrical cabinet according to claim 1, comprising:
   an electrical apparatus isolated from surroundings by said electrical cabinet.

10. An electrical cabinet according to claim 1, wherein said electrical cabinet is an electrical cabinet configured for outdoor installation.

* * * * *